(12) United States Patent
Braganca et al.

(10) Patent No.: US 8,320,080 B1
(45) Date of Patent: Nov. 27, 2012

(54) THREE-TERMINAL SPIN-TORQUE OSCILLATOR (STO)

(75) Inventors: Patrick Mesquita Braganca, San Jose, CA (US); Bruce Alvin Gurney, San Jose, CA (US); Jordan Asher Katine, Mountain View, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 13/149,419

(22) Filed: May 31, 2011

(51) Int. Cl.
*G11B 5/127* (2006.01)
*G11B 5/187* (2006.01)

(52) U.S. Cl. ............... 360/128; 360/125.3; 360/125.71
(58) Field of Classification Search ............ 360/125.3, 360/125.71, 128, 324.2
See application file for complete search history.

(56) References Cited

U.S. PATENT DOCUMENTS

| | | | |
|---|---|---|---|
| 5,695,864 A | 12/1997 | Slonczewski | |
| 7,577,021 B2 | 8/2009 | Guo et al. | |
| 7,616,412 B2 * | 11/2009 | Zhu et al. | 360/324.2 |
| 7,667,933 B2 | 2/2010 | Kudo et al. | |
| 7,678,475 B2 * | 3/2010 | Slavin et al. | 428/811 |
| 7,813,087 B2 * | 10/2010 | Sato et al. | 360/324.1 |
| 7,957,098 B2 * | 6/2011 | Yamada et al. | 360/125.3 |
| 7,982,996 B2 * | 7/2011 | Smith et al. | 360/59 |
| 8,064,244 B2 * | 11/2011 | Zhang et al. | 365/158 |
| 8,139,322 B2 * | 3/2012 | Yamada et al. | 360/125.3 |
| 8,194,361 B2 * | 6/2012 | Kudo et al. | 360/324.11 |
| 2006/0222835 A1 | 10/2006 | Kudo et al. | |
| 2009/0080120 A1 * | 3/2009 | Funayama et al. | 360/319 |
| 2009/0201614 A1 | 8/2009 | Kudo et al. | |
| 2010/0033881 A1 | 2/2010 | Carey et al. | |
| 2010/0110592 A1 * | 5/2010 | Koui et al. | 360/324 |
| 2010/0328799 A1 | 12/2010 | Braganca et al. | |
| 2011/0216447 A1 * | 9/2011 | Li et al. | 360/313 |
| 2011/0279921 A1 * | 11/2011 | Zhang et al. | 360/59 |
| 2012/0038430 A1 * | 2/2012 | Kim et al. | 331/154 |
| 2012/0056685 A1 * | 3/2012 | Lee et al. | 331/154 |
| 2012/0075752 A1 * | 3/2012 | Sato et al. | 360/324 |
| 2012/0170151 A1 * | 7/2012 | Oikawa et al. | 360/110 |

OTHER PUBLICATIONS

Braganca, et al., "A Three-Terminal Approach to Developing Spin-Torque Written Magnetic Random Access Memory Cells", IEEE Transactions on Nanotechnology, vol. 8, No. 2, Mar. 2009, pp. 190-195.
Braganca, et al., "Nanoscale magnetic field detection using a spin torque oscillator", Nanotechnology 21 (2010) 235202 (6pp).
Sun et al., "A three-terminal spin-torque-driven magnetic switch", Applied Physics Letters 95, 083506 2009.

(Continued)

*Primary Examiner* — Brian Miller
(74) *Attorney, Agent, or Firm* — Thomas R. Berthold

(57) ABSTRACT

A spin-torque oscillator (STO) has a single free ferromagnetic layer that forms part of both a giant magnetoresistance (GMR) structure with a nonmagnetic conductive spacer layer and a tunneling magnetoresistance (TMR) structure with a tunnel barrier layer. The STO has three electrical terminals that connect to electrical circuitry that provides a spin-torque excitation current through the conductive spacer layer and a lesser sense current through the tunnel barrier layer. When the STO is used as a magnetic field sensor, the excitation current causes the magnetization of the free layer to oscillate at a fixed base frequency in the absence of an external magnetic field. A detector coupled to the sense current detects shifts in the free layer magnetization oscillation frequency from the base frequency in response to external magnetic fields.

21 Claims, 7 Drawing Sheets

OTHER PUBLICATIONS

Fuchs et al., "Adjustable spin torque in magnetic tunnel junctions with two fixed layers", Applied Physics Letters 86, 152509 (2005).

Kimura et al., "Switching Magnetization of a Nanoscale Ferromagnetic Particle Using Nonlocal Spin Injection", PRL 96, 037201 (2006).

Mizushima et al., "Signal-to-noise ratios in high-signal-transfer-rate read heads composed of spin-torque oscillators", Journal of Applied Physics 107, 063904 2010.

Bonetti et al., "Spin torque oscillator frequency versus magnetic field angle: The prospect of operation beyond 65 GHz", Applied Physics Letters 94, 102507 (2009).

Zhu, et al., "Microwave Assisted Magnetic Recording", IEEE Transactions on Magnetics, vol. 44, No. 1, Jan. 2008, pp. 125-131.

* cited by examiner

THREE-TERMINAL SPIN-TORQUE OSCILLATOR (STO)

BACKGROUND OF THE INVENTION

1. Field of the Invention

The invention relates generally to a spin-torque oscillator (STO), and more particularly to a magnetic field sensor and sensing system that uses a STO sensor.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field, such as from the recorded magnetic bits on the disk, is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu or Ag. In a CPP-TMR read head the nonmagnetic spacer layer is formed of an electrically insulating material, such as $TiO_2$, MgO or $Al_2O_3$.

In CPP MR sensors, it is desirable to operate the sensors at a high bias or sense current density to maximize the signal and signal-to-noise ratio (SNR). However, it is known that CPP MR sensors are susceptible to current-induced noise and instability. The spin-polarized bias current flows perpendicularly through the ferromagnetic layers and produces a spin-torque (ST) effect on the local magnetization. This can produce fluctuations of the magnetization, resulting in substantial low-frequency magnetic noise if the sense current is large.

An alternative sensor based on a CPP-GMR or CPP-TMR sensor structure, called a spin-torque oscillator (STO) sensor, is designed so that the spin torque effect generates persistent precession of the magnetization. When a fixed direct current higher than $I_c$, called the critical current, is directed through the STO sensor, the magnetization of the free layer precesses or oscillates by virtue of the ST effect. In appropriately designed structures the frequency of this precession (oscillation frequency) shifts with the application of an external magnetic field, and these frequency shifts can be used to detect changes in the external magnetic field. Thus, STO sensors have been proposed for use as read heads in magnetic recording disk drives to replace conventional CPP-GMR and CPP-TMR read heads, as described for example in US 20100328799 A1 assigned to the same assignee as this application, and in US 20090201614 A1.

An STO sensor based on a CPP-GMR sensor can operate at very high current densities due to its nonmagnetic conductive spacer layer between the reference and free layers, but has a very small output signal as a result of its low magnetoresistance ($\Delta R/R$). An STO sensor based on a CPP-TMR sensor has a significantly higher magnetoresistance but is susceptible to dielectric breakdown of the tunnel barrier at high current density.

What is needed is a STO for use in a system, like a magnetic field sensing system, that has a high output signal that is not susceptible to dielectric breakdown of the tunnel barrier.

SUMMARY OF THE INVENTION

The invention is a spin-torque oscillator (STO) with a single free layer that forms part of both a GMR structure with a nonmagnetic conductive spacer layer and a TMR structure with a tunnel barrier layer. The STO has three electrical terminals that connect to electrical circuitry that provides a spin-torque excitation current through the conductive spacer layer and a lesser sense current through the tunnel barrier layer. The STO has applications for use as an oscillator in mixers, radios, cell phones and radar (including vehicle radar), and as an oscillator in microwave-assisted magnetic recording (MAMR).

In one specific application the STO is a magnetic field sensor, such as a current-perpendicular-to-the-plane (CPP) disk drive read head. In this application the STO sensor has a single free ferromagnetic layer that has an in-plane magnetization substantially free to oscillate in the presence of external magnetic fields to be sensed, such as the magnetized "bits" or regions on the disk. The free layer forms part of both a TMR structure with tunnel barrier layer and a first reference layer having a fixed in-plane magnetization, and a GMR structure with a nonmagnetic conductive spacer layer and a second reference layer having a fixed in-plane magnetization. The STO sensor has three electrical contacts or terminals for connection to electrical circuitry. A first terminal is electrically coupled to the first reference layer, a second terminal is electrically coupled to the second reference layer, and a third terminal is electrically coupled to either the conductive spacer layer or the free layer. The electrical circuitry connected to the STO terminals includes an excitation current source and a sense current source. The excitation current is greater that the critical current for the GMR structure and is high enough to provide sufficient current density to cause the magnetization of the free layer to oscillate at a fixed base frequency in the absence of an external magnetic field. The sense current is less than the critical current for the TMR structure. A detector coupled to the sense current detects shifts in the free layer magnetization oscillation frequency from the base frequency in response to the external magnetic fields from the magnetized regions of the disk.

For a fuller understanding of the nature and advantages of the present invention, reference should be made to the following detailed description taken together with the accompanying figures.

DETAILED DESCRIPTION OF THE INVENTION

Prior Art

The three-terminal STO according to the invention has applications other than as a magnetic field sensor, but will be described in detail below as a magnetic recording disk drive read head.

Figure 1:
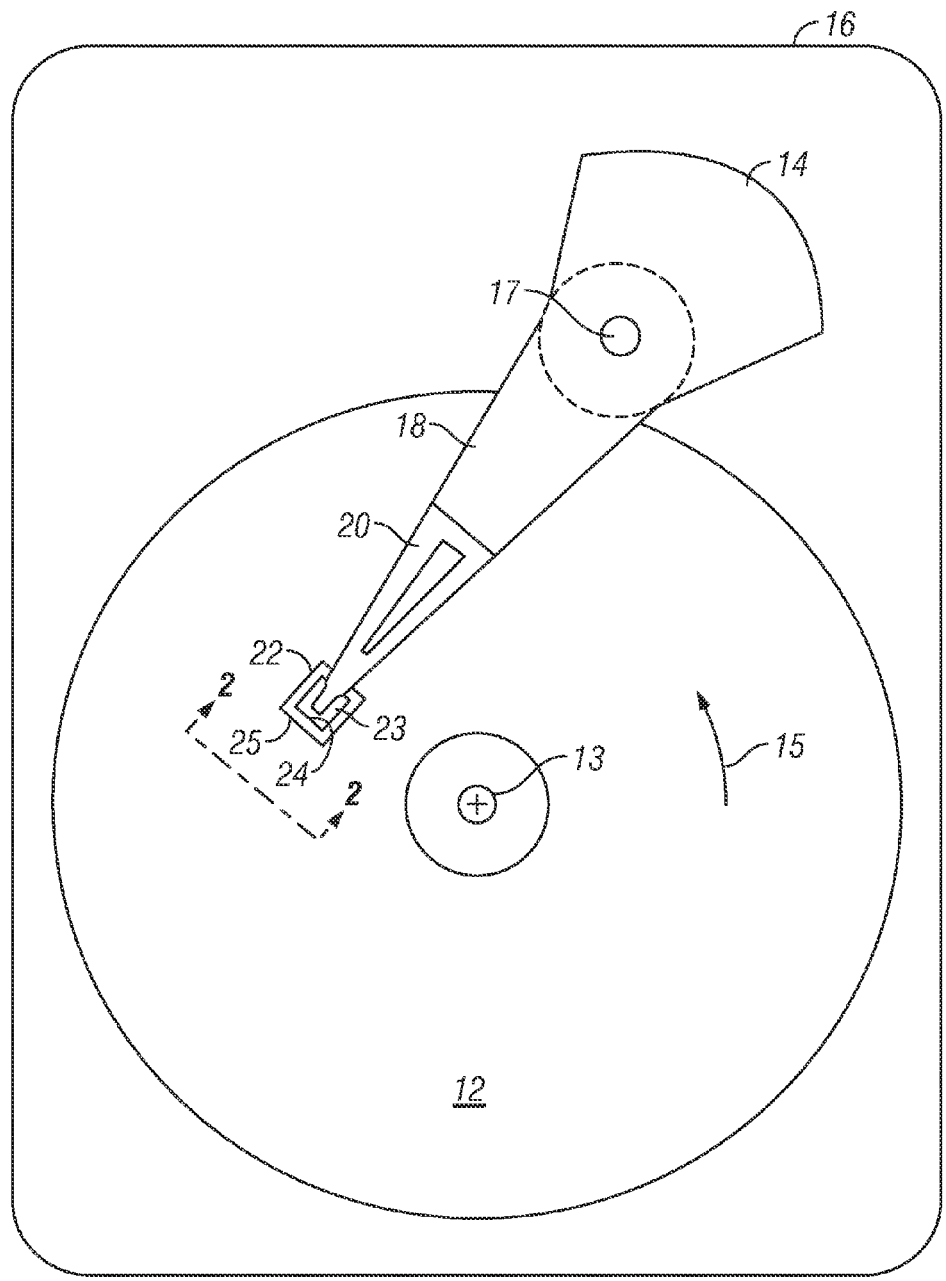
FIG. 1 is a schematic top view of a conventional magnetic recording hard disk drive with the cover removed.

FIGS. 1-4 illustrate a conventional CPP magnetoresistive (MR) magnetic field sensing sensor and system. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
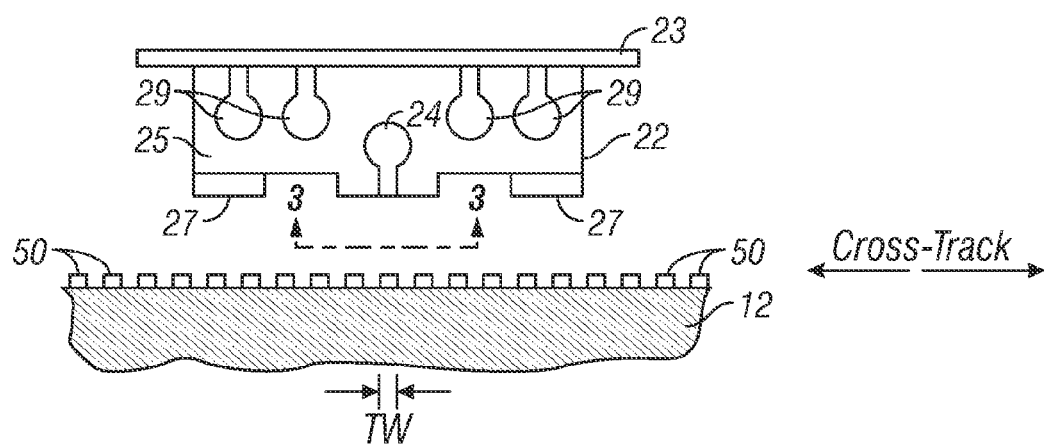
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
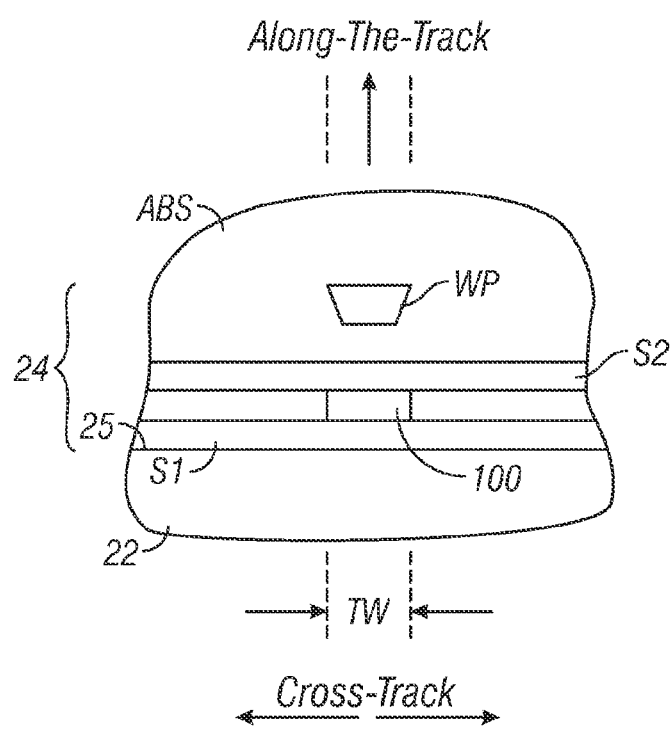
FIG. 3 is a view in the direction 3-3 of FIG. 2 and shows the air-bearing surface (ABS) of the slider with the ends of the read/write head.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields 51, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields 51, S2. FIG. 3 is not to scale because of the difficulty in showing very small dimensions. Typically each shield 51, S2 is several microns thick in the along-the-track direction, as compared to the total thickness of the read head 100 in the along-the-track direction, which may be in the range of 20 to 40 nm.

Figure 4:
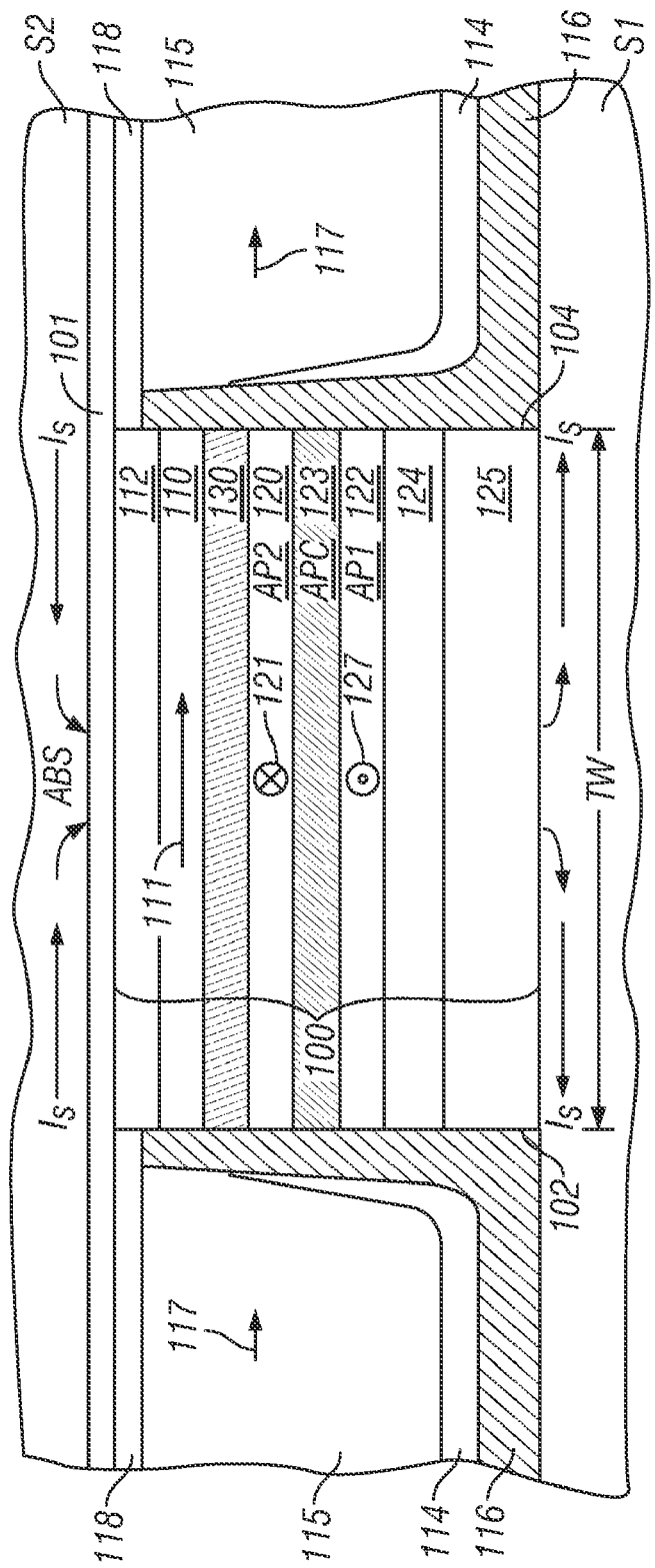
FIG. 4 is a cross-sectional schematic view of the ABS of a current-perpendicular-to-the-plane magnetoresistive (CPP MR) read head showing the stack of layers located between the magnetic shield layers according to the prior art.

FIG. 4 is a view of the ABS showing the layers making up a CPP MR sensor structure as would be viewed from the disk. Sensor 100 is a CPP MR read head comprising a stack of layers formed between the two magnetic shield layers 51, S2. The sensor 100 has a front edge at the ABS and spaced-apart side edges 102, 104 that define the track width (TW). The shields 51, S2 are formed of electrically conductive material and thus may also function as electrical leads for the bias or sense current $I_s$, which is directed generally perpendicularly through the layers in the sensor stack. Alternatively, separate electrical lead layers may be formed between the shields 51, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The CPP MR sensor 100 may be a CPP GMR sensor, in which case the nonmagnetic spacer layer 130 would be formed of an electrically conducting material, typically a metal like Cu, Au or Ag. Alternatively, the CPP MR sensor 100 may be a CPP tunneling MR(CPP-TMR) sensor, in which case the nonmagnetic spacer layer 130 would be a tunnel barrier formed of an electrically insulating material, like $TiO_2$, MgO or $Al_2O_3$.

The pinned ferromagnetic layer in a CPP MR sensor may be a single pinned layer or an antiparallel (AP) pinned structure like that shown in FIG. 4. An AP-pinned structure has first (AP1) 122 and second (AP2) 120 ferromagnetic layers separated by a nonmagnetic antiparallel coupling (APC) layer 123 with the magnetization directions of the two AP-pinned ferromagnetic layers oriented substantially antiparallel. The AP2 layer 120, which is in contact with the nonmagnetic APC layer 120 on one side and the sensor's electrically nonmagnetic spacer layer 130 on the other side, is typically referred to as the reference layer. The AP1 layer 122, which is typically in contact with an antiferromagnetic layer 124 or hard magnet pinning layer on one side and the nonmagnetic APC layer 123 on the other side, is typically referred to as the pinned layer. The AP-pinned structure minimizes the net magnetostatic coupling between the reference/pinned layers and the CPP MR free ferromagnetic layer. The AP-pinned structure is sometimes also called a "laminated" pinned layer or a synthetic antiferromagnet (SAF).

The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. Alternatively, the AP-pinned structure may be "self-pinned". In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net moment of the AP-pinned structure, remains high.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_s$ is applied from top shield S2 perpendicularly through the sensor stack to bottom shield S1 (or from S1 to S2), the magnetic fields from the recorded data on the disk will cause rotation of the free-layer magnetization 111 relative to the reference-layer magnetization 121, which is detectable as a change in electrical resistance.

A ferromagnetic biasing layer 115, such as a CoPt or CoCrPt hard magnetic bias layer, is also typically formed outside of the sensor stack near the side edges 102, 104 of the sensor 100. The biasing layer 115 is electrically insulated from side edges 102, 104 of sensor 100 by insulating layer 116. An optional seed layer 114, such as a Cr alloy like CrMo or CrTi, may be deposited on the insulating layer 116 to facilitate the growth of the biasing layer 115, particularly if the biasing layer is a CoPt or CoPtCr layer. A capping layer 118, such as layer of Cr, or a multilayer of Ta/Cr is deposited on top of the biasing layer 115. The upper layer of capping layer 118, for example Cr, also serves the purpose as a chemical-mechanical-polishing (CMP) stop layer during fabrication of the sensor. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110. The ferromagnetic biasing layer 115 may be a hard magnetic bias layer or a ferromagnetic layer that is exchange-coupled to an antiferromagnetic layer. A seed layer 101, such as a NiFe layer, for the shield layer S2 may be located over the sensor 100 and capping layer 118.

In the presence of an external magnetic field in the range of interest, i.e., magnetic fields from recorded data on the disk 12, the magnetization direction 111 of free layer 110 will rotate while the magnetization direction 121 of reference layer 120 will remain substantially fixed and not rotate. The rotation of the free-layer magnetization 111 relative to the reference-layer magnetization 121 results in a change in electrical resistance. Hence, when a sense direct current $I_s$ is directed through the stack of layers in sensor 100, the resistance change is detected as a voltage signal proportional to the strength of the magnetic signal fields from the recorded data on the disk. If $I_s$ is greater than some critical current ($I_c$) the spin-torque (ST) effect can produce gyrations or fluctuations of the free layer magnetization, resulting in substantial low-frequency magnetic noise that reduces the sensor's signal-to-noise ratio (SNR) to an undesirable level.

An alternative sensor based on a CPP-GMR or CPP-TMR sensor, called a spin torque oscillator (STO) sensor, operates at a sense current greater than L to take advantage of the ST-induced forces acting on the free layer. When a fixed direct current higher than $I_c$ is directed through this type of STO sensor, the magnetization of the free layer precesses or oscillates by virtue of the ST effect. The frequency of this precession (oscillation frequency) shifts with the application of an external magnetic field, and these frequency shifts can be used to detect changes in the external magnetic field. Thus, STO sensors have been proposed for use as read heads in magnetic recording disk drives to replace conventional CPP-GMR and CPP-TMR read heads, as described for example in US 20100328799 A1 assigned to the same assignee as this application, and in US 20090201614 A1.

An STO sensor based on a CPP-GMR sensor can operate at very high current densities due to its conductive spacer layer between the reference and free layers, but has a very small output signal as a result of its low magnetoresistance ($\Delta R$). An STO sensor based on a CPP-TMR sensor has a significantly higher magnetoresistance but is susceptible to dielectric breakdown of the tunnel barrier at high current density.

THE INVENTION

Figure 5:
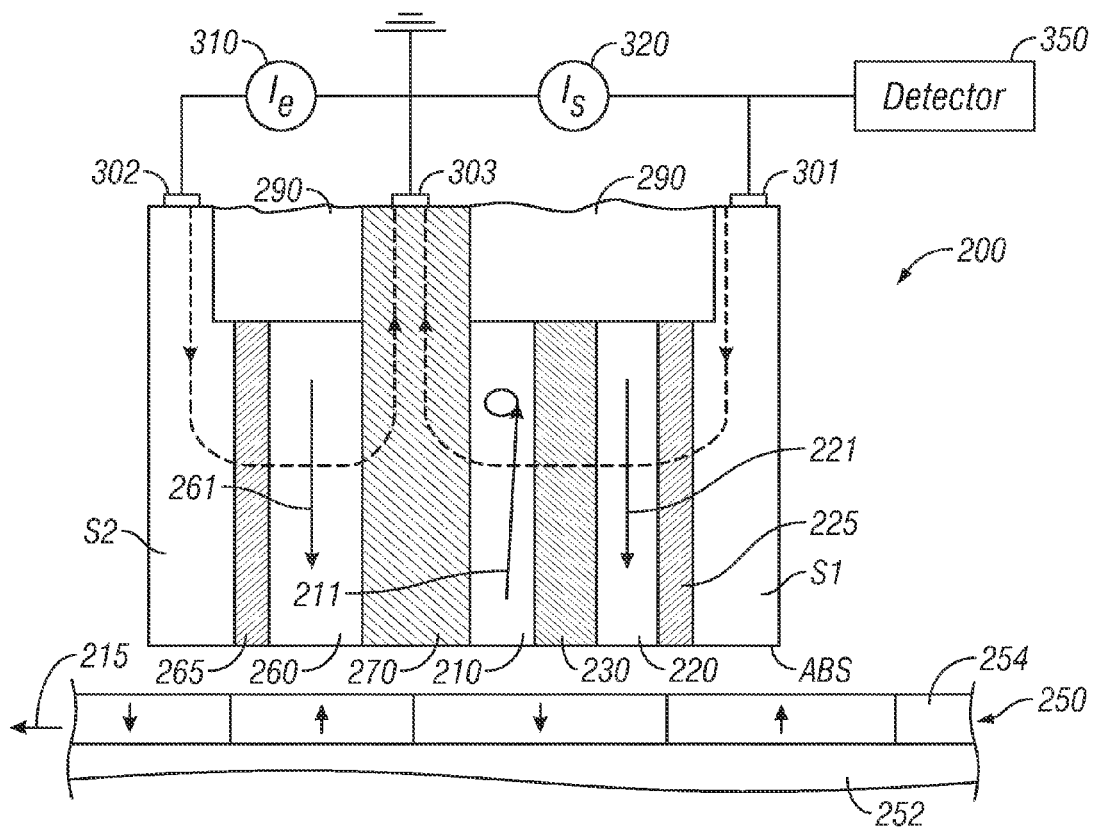
FIG. 5 is a schematic of a magnetic field spin-torque oscillator (STO) sensing system according to an embodiment of the invention in a magnetic recording disk drive implementation.

The STO sensor according to the present invention uses the positive aspects of both CPP-GMR and CPP-TMR sensors to operate at a high current density and to provide a high output signal. FIG. 5 is a schematic of a magnetic field sensing system using a STO sensor 200 according to an embodiment of the invention. The system is illustrated as a magnetic recording disk drive with STO sensor 200 with its ABS facing the disk 250. The sensor 200 includes a set of individual layers and features of both a CPP-GMR sensor and a CPP-TMR sensor as previously-described with respect to CPP sensor 100. The disk 250 has a substrate 252 and a recording layer 254 that serves as the magnetic recording medium with magnetized regions depicted by the arrows directed toward or away from the ABS. As the disk rotates, the magnetized regions move in the direction of arrow 215 past the sensor 200. The recording layer 254 is depicted as a perpendicular magnetic recording medium with the regions magnetized perpendicularly to the plane of recording layer 254, but alternatively it may be a longitudinal magnetic recording medium with the regions being magnetized in the plane of recording layer 254. The STO sensor 200 has a first shield layer S1 that may serve as a substrate for the deposition of the set of layers, a second shield layer S2, and a single free ferromagnetic layer 210 that has a substantially in-plane magnetization 211 free to oscillate in the presence of an external magnetic field to be sensed. The free layer 210 forms part of both a TMR structure with tunnel barrier layer 230 and a first reference layer 220 having a fixed in-plane magnetization 221, and a GMR structure with nonmagnetic conductive spacer layer 270 and second reference layer 260 having a fixed in-plane magnetization 261. Each of the reference layers 220, 260 may be a single pinned layer or the AP2 layer of an AP-pinned structure. A non-ferromagnetic conducting metal layer 225 is located between S1 and first reference layer 220 for breaking any magnetic exchange interaction between S1 and first reference layer 220 or other ferromagnetic layers in the sensor stack while permitting electrical conduction. Similarly, a non-ferromagnetic conducting metal layer 265 is located between S2 and second reference layer 260. Typical materials for layers 225, 265 are Cu, Ag, Ta and Ru. The order of the sensor layers in the stack could be reversed from what is shown in FIG. 5, with second reference layer 260 being deposited first on layer 265 on S1, followed by conductive spacer layer 270, free layer 210, tunnel barrier layer 230, first reference layer 220, and layer 225, with S2 being located on layer 225.

The STO sensor 200 has three electrical contacts or terminals for connection to electrical circuitry 300. Terminal 301 is electrically coupled to the first reference layer 220 via S1, terminal 302 is electrically coupled to the second reference layer 260 via S2, and terminal 303 is electrically coupled to either the conductive spacer layer 270 or to the free layer 210. In the embodiment of FIG. 5 terminal 303 is connected to conductive spacer layer 270, but may be connected to either the conductive spacer layer 270 or the free layer 210. The terminals 301, 302, 303 are depicted for ease of illustration in FIG. 5 as being directly connected to their respective layers, but would likely be located on the trailing surface of the slider, as depicted in FIG. 2 by terminal pads 29 on trailing surface 25 of slider 22. The sensor includes insulating material 290 in the back region recessed from the ABS for electrically isolating S1, conductive spacer layer 270 and S2 from one another.

The circuitry connected to STO sensor 200 includes a constant current source 310 that supplies a direct current (DC) excitation current $I_e$ between terminals 302, 303 through the conductive spacer layer 270, and a constant current source 320 that supplies a direct DC sense current $I_s$ between terminals 301, 303 through the tunnel barrier layer 230. The excitation current is greater than the critical current $I_c$ for the GMR structure and is high enough to provide sufficient current density to cause the magnetization 211 of the free layer 210 to oscillate at a fixed base frequency in the absence of an external magnetic field. The sense current $I_s$ is less than the critical current $I_c$ for the TMR structure. A detector 350 is coupled to the circuitry for sense current $I_s$. The detector 350 detects shifts in the free layer magnetization 211 oscillation frequency from the base frequency in response to the external magnetic fields from the magnetized regions of recording layer 254. The current source 310 may instead apply an alternating current (AC) excitation current or an AC excitation current with a DC bias. This can allow for frequency locking of the oscillator to a fixed driving frequency, with associated pulling and detection of the magnetic field by phase detection, as is known in the literature, for example "Injection Locking and Pulling in Oscillators", B Razavi, et al, *IEEE J of Solid State Circuits* 39, 1415 (2004), and U.S. Pat. No. 7,633,699).

The single free layer 210 is a common free layer shared by the GMR and TMR structures and the three-terminal connection to the circuitry decouples $I_e$ from I. The higher $I_e$ for exciting ST oscillations is passed through the conductive spacer 270 while the lower $I_s$ is passed through the tunnel barrier layer 230 to sense the oscillation of free layer magnetization 211 generated by $I_e$ through the GMR structure. The low $I_s$ keeps the voltage across the tunnel barrier layer 230 low to avoid dielectric breakdown, while still taking advantage of the much larger magnetoresistance signal of the TMR structure.

In the preferred embodiment the magnetizations 221, 261 of the two reference layers 220, 260, respectively, should be substantially parallel to one another to obtain the highest critical current. In the absence of an external magnetic field the magnetization 211 of free layer 210 should be substantially antiparallel to the magnetizations 221, 261 of the two reference layers 220, 260, respectively, and substantially perpendicular to the ABS. The magnetization 211 of free layer 210 can point either toward or away from the recording layer 254. In an alternative embodiment, the magnetizations 221, 261 of the two reference layers 220, 260, respectively, can be substantially antiparallel. This would lower the threshold current but can help to control the effective field on free layer 210 through magnetostatic interactions from the reference layers 220, 260.

The manner of connection of the excitation current source 310 to the GMR structure defines the manner in which ST is imparted into the free layer 210. In the embodiment of FIG. 5, the third terminal 303 is connected to conductive spacer layer 270. This is the "reflection" mode because most electrons do not flow through the free layer 210, but rather a spin current is generated by spin accumulation in the conductive spacer layer 270 that imparts ST to the free layer 210. An alternative embodiment of the STO sensor 200 would be identical to FIG. 5 except that terminal 303 is connected to the free layer 210 instead of the conductive spacer layer 270. This is the "transmission" mode because the electrons flow into the free layer 210 and directly impart ST to the free layer 210. The transmission mode is more efficient in imparting ST and thus a smaller excitation current is required than is required for reflection mode.

As one example of a disk drive STO sensor according to the invention operating in reflection mode, the density of the critical current I, may be on the order of $10^7$-$10^8$ A/cm². An excitation current $I_e$ with a current density of 3-5×$10^7$ (transmission) or 1-5×$10^8$ (reflection) A/cm² would cause the magnetization 211 of free layer 210 to precess or oscillate at a resonance or base frequency of about 4-8 GHz (depending on the saturation magnetization of the ferromagnetic material used) in the absence of an external magnetic field. The positive and negative magnetizations in the recording layer 254 may generate magnetic fields of 100-500 Oe at the height at which the sensor passes above the media and pass the free layer 210 at a frequency of up to 2 GHz. This field would cause shifts in the base frequency of oscillation of the magnetization 211 of free layer 210 of about ±1 GHz. The sense current $I_s$ would have a current density of about $10^7$ A/cm². The detector 350 can measure the frequency of oscillation of the free layer magnetization by measuring the change in electrical resistance across the tunnel barrier layer 230. In one detection technique, the frequency modulation (FM) signal from the free layer magnetization oscillations is converted to a train of voltage pulses (a digital signal) and a delay detection method is employed for the FM detection. (K. Mizushima, et al., "Signal-to-noise ratios in high-signal-transfer-rate read heads composed of spin-torque oscillators", *J. Appl. Phys.* 107, 063904 2010).

Figure 6:
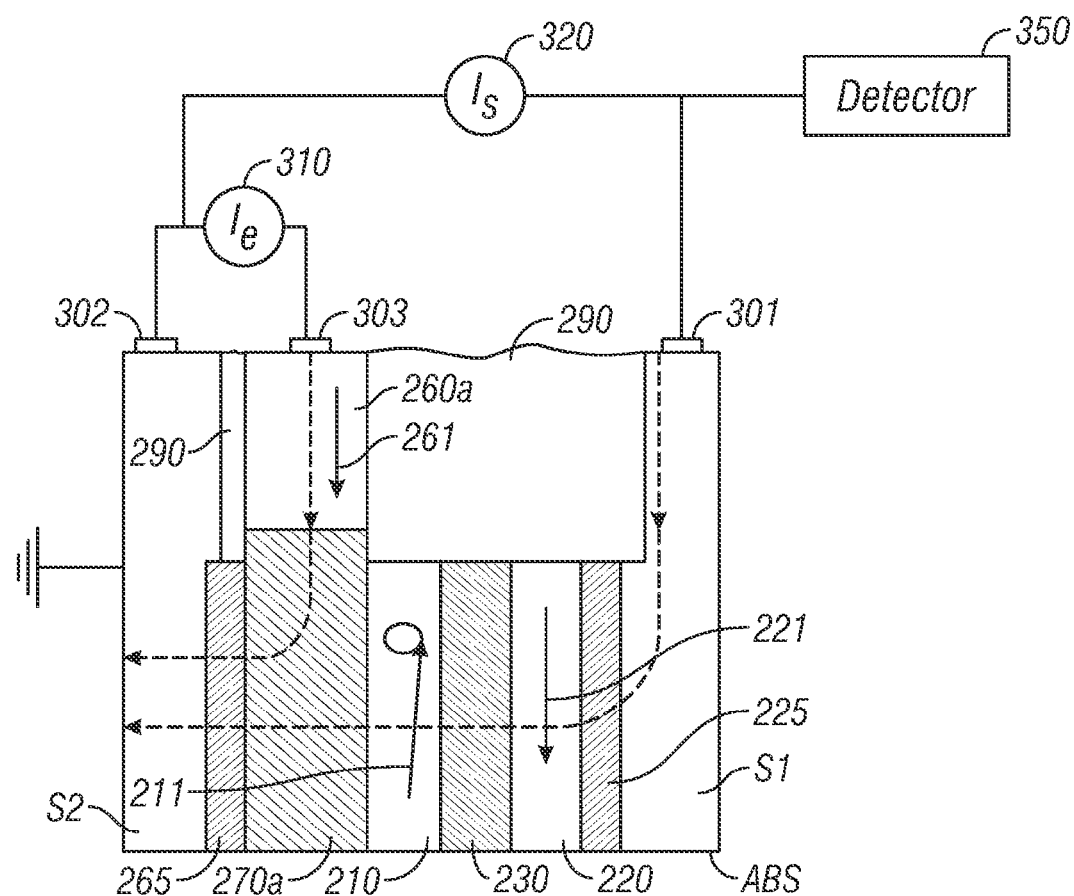
FIG. 6 is a schematic of the embodiment of FIG. 5 with the STO sensor in reflection mode but wherein the second reference layer is not in the stack but recessed from the ABS.

For magnetic recording applications it is desirable to fit the STO sensor layers into as narrow a space as possible between the magnetic shields to achieve the highest spatial resolution of the recorded magnetic bits in the along-the-track direction (parallel to the direction of arrow 215 in FIG. 5). In FIG. 5, the set of layers is in the form of a stack of layers with each layer deposited sequentially on the substrate, e.g., 51, with tunnel barrier layer 230 being in contact with one surface of free layer 210 and the conductive spacer layer 270 being in contact with the opposite surface of free layer 210. FIG. 6 shows a modification of the embodiment of FIG. 5 with the STO sensor in reflection mode but wherein the second reference layer 260a is not in the stack but is generally formed in the same plane as the conductive spacer layer 270a. The second reference layer 260a is shown recessed from the ABS in FIG. 6 but alternatively it could be located to either the side of the conductive spacer layer 270a (the cross-track direction) and still be generally formed in the same plane as the conductive spacer layer 270a. In either case the S1-S2 shield-to-shield spacing is reduced from the embodiment of FIG. 5. In this reflection-mode embodiment terminal 303 makes its connection to conductive spacer layer 270a through second reference layer 260a and the excitation current passes through the recessed second reference layer 260a and the conductive spacer layer 270a.

Figure 7:
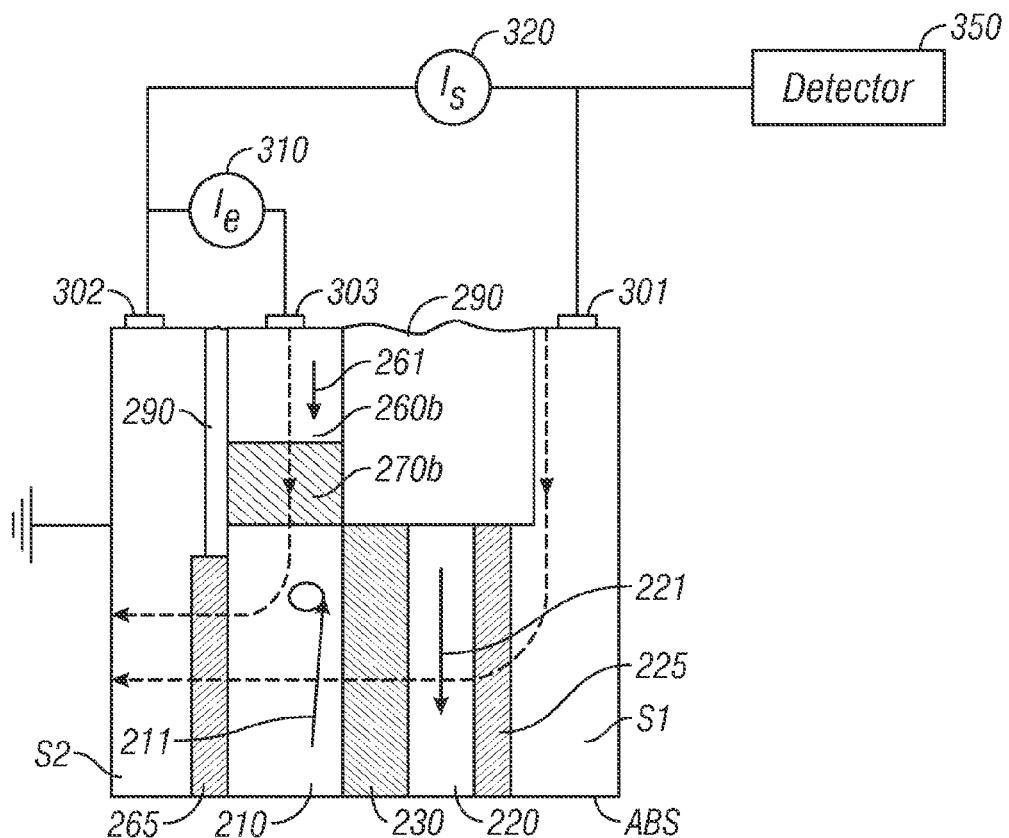
FIG. 7 is a schematic of an embodiment with the STO sensor in transmission mode but wherein both the second reference layer and the nonmagnetic conductive spacer layer are not in the stack but recessed from the ABS.

FIG. 7 shows an embodiment with the STO sensor in transmission mode but wherein both the second reference layer 260b and the nonmagnetic conductive spacer layer 270b are not in the stack but are both generally formed in the same plane as the free layer 210. The second reference layer 260b and conductive spacer layer 270b are shown recessed from the ABS in FIG. 7 but alternatively they could be located to either the side of the free layer 210 (the cross-track direction) and still be generally formed in the same plane as the free layer 210. In either case the S1-S2 shield-to-shield spacing is reduced from the embodiment of FIG. 5. In this transmission-mode embodiment the excitation current passes through the recessed second reference layer 260b, the conductive spacer layer 270b and the free layer 210.

Figure 8:
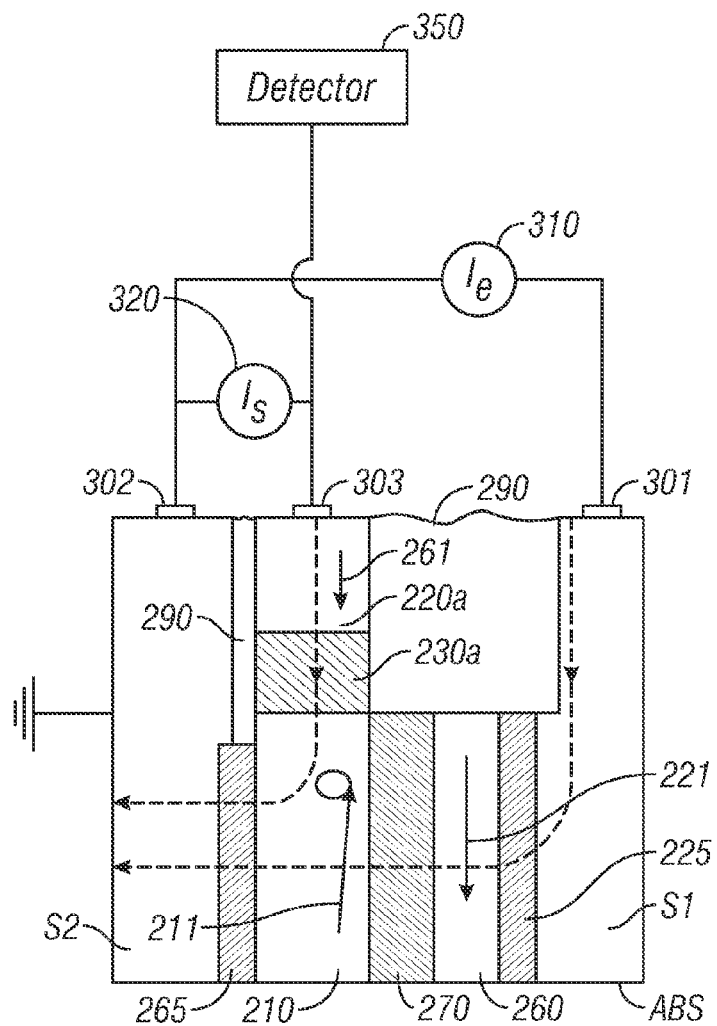
FIG. 8 is a schematic of an embodiment with the STO sensor in transmission mode but wherein both the first reference layer and the tunnel barrier layer are not in the stack but are recessed from the ABS.

FIG. 8 shows an embodiment with the STO sensor in transmission mode but wherein both the first reference layer 220a and the tunnel barrier layer 230a are not in the stack but are both generally formed in the same plane as the free layer 210. The first reference layer 220a and tunnel barrier layer 230a are shown recessed from the ABS in FIG. 8 but alternatively they could be located to either the side of the free layer 210 (the cross-track direction) and still be generally formed in the same plane as the free layer 210. In either case the S1-S2 shield-to-shield spacing is reduced from the embodiment of FIG. 5. In this transmission-mode embodiment the excitation current passes from S1 through the nonmagnetic spacer layer 270 and free layer 210 to S2.

Because in the present invention it is necessary that the STO sensor 200 operates at current levels above $I_c$ to induce the spin-torque effect in the free layer 210, the properties of the materials used for the free layer in the CPP sensor can be chosen to reduce or increase $I_c$, and thus change the level of excitation current $I_e$ that needs to be supplied. For example a lower $I_c$ may be desirable to limit the power dissipated in generating free layer oscillations, The use of certain types of materials for the free layer to change the excitation current in a STO sensor are described in application Ser. No. 12/188,183, filed Aug. 7, 2008 and assigned to the same assignee as this application.

The critical current is given generally by the following:

$$I_C = (\alpha/g)M_s t(H_k + 2\pi M_s),$$

where $\alpha$ is the damping parameter, g is a parameter that depends on the spin-polarization of the ferromagnetic material, $M_s$ is the saturation magnetization and t the thickness of the free layer, and $H_k$ is the anisotropy field of the free layer. The product $M_s*t$ is determined by the flux from the recorded bits on the disk and is typically given in terms of equivalent thicknesses of NiFe alloy, for example 40 Å equivalent of permalloy (~800 emu/cm³). Thus a free layer material with desirable values for the parameters $\alpha$, $M_s$, and $H_k$ can be selected to change $I_c$. For example, $Ni_{81}Fe_{19}$ exhibits a low $\alpha$ of about 0.01 to 0.02, low $M_s*t$ of about 800 emu/cm³ and low intrinsic anisotropy field $H_k$ of about 1 Oe.

Also, high spin-polarization materials will decrease $I_c$ significantly by increasing the value of the parameter g, which depends on the spin-polarization of the ferromagnetic material. Thus the free ferromagnetic layer 210 may be formed of or comprise a ferromagnetic Heusler alloy, some of which are known to exhibit high spin-polarization in their bulk form. Full and half Heusler alloys are intermetallics with particular composition and crystal structure. Examples of Heusler alloys include but are not limited to the full Heusler alloys $Co_2MnX$ (where X is one or more of Al, Sb, Si, Sn, Ga, or Ge), $Co_2FeSi$, and $Co_2Fe_xCr_{(1-x)}Al$ (where x is between 0 and 1). Examples also include but are not limited to the half Heusler alloys NiMnSb, and PtMnSb. A perfect Heusler alloy will have 100% spin-polarization. However it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the $L2_1$ Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys.

Another class of materials that can be used are those with short spin-diffusion length comparable to the thickness of a typical free layer. Similar to materials with high spin-polarization they are effective in scattering spins over a short length scale and thus induce spin-torque instabilities. One such preferred material has a composition of $(Co_xFe_{100-x})_{(100-y)}M_y$, where M is an element selected from the group consisting of Al, Ge and Si and where x is between about 40 and 60 and y is between about 20 and 40. These materials have the advantage of reasonably high spin-polarization and low magnetic damping, which is desirable in the sensor of this invention to reduce $I_C$.

As previously mentioned, while the three-terminal STO according to the invention has been described in detail with application as a magnetic field sensor, in particular a magnetic recording disk drive read head, the invention has other applications. Other applications of the three-terminal STO, all of which would benefit from being able to use the sense current through the tunnel barrier layer to detect the frequency or phase of the free layer oscillation include mixers, radio, cell phones and radar (including vehicle radar). See for example, "STO frequency vs. magnetic field angle: The prospect of operation beyond 65 GHz", by Bonetti et al, *APL* 94 102507 (2009).

Still another application is for high-frequency assisted writing in magnetic recording, such as a magnetic recording disk drive. In this technique, also called microwave-assisted magnetic recording (MAMR), the STO applies a high-frequency oscillatory magnetic field to the magnetic grains of the recording layer as a magnetic field auxiliary to the magnetic write field from the conventional write head. The auxiliary field may have a frequency close to the resonance frequency of the magnetic grains in the recording layer to facilitate the switching of the magnetization of the grains at lower write fields from the conventional write head than would otherwise be possible without assisted recording. In one type of MAMR system, a two-terminal STO based on either GMR or TMR, operates with the magnetization of the reference layer and the magnetization of the free layer, in the absence of an excitation current, oriented perpendicular to the planes of the layers. See for example "Microwave Assisted Magnetic Recording", by J. G. Zhu et al., *IEEE Transactions on Magnetics*, Vol. 44, No. 1, January 2008, pp. 125-131. Thus when the three-terminal STO according to the invention, like that shown in FIG. 5, is used as a STO for MAMR, the magnetizations 221, 261 of reference layers 220, 260, respectively, would be oriented perpendicular to the planes of the layers, and the magnetization 211 of the free layer 210, in the absence of excitation current $I_e$, would also be oriented perpendicular to the plane of the layer. The sense current $I_s$ through the tunnel barrier layer 230 is then used to monitor the frequency of the oscillation of the free layer magnetization 211.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A spin-torque oscillator (STO) comprising:
a substrate; and
a set of layers on the substrate comprising:
a free ferromagnetic layer having a magnetization that oscillates in the presence of an excitation current perpendicularly through the plane of the free layer;
a first ferromagnetic reference layer having a fixed magnetization;
a nonmagnetic tunnel barrier layer between and in contact with the free layer and the first reference layer;
a second ferromagnetic reference layer having a fixed magnetization;
a nonmagnetic electrically conductive spacer layer between and in contact with the free layer and the second reference layer; and
three electrical terminals for connection of electrical circuitry to the oscillator, wherein a first of said three terminals is electrically coupled to the first reference layer, a second of said three terminals is electrically coupled to the second reference layer, and the third of said three terminals is electrically coupled to one of said conductive spacer layer and said free layer.

2. The STO of claim 1 wherein the magnetization of each of the first and second reference layers is oriented substantially perpendicular to the plane of the layer.

3. The STO of claim 1 wherein the magnetization of each of the first and second reference layers is oriented substantially in the plane of the layer.

4. The STO of claim 3 wherein the magnetization directions of the first and second reference layers are substantially parallel to one another, and wherein the magnetization direction of the free layer, in the absence of an excitation current, is substantially antiparallel to the magnetization directions of the first and second reference layers.

5. The STO according to claim 1 further comprising electrical circuitry connected to the set of layers for supplying an excitation current through the conductive spacer layer, the excitation current being selected from a direct current (DC) and an alternating current (AC) and having sufficient current density to cause the magnetization of the free layer to oscillate, and for supplying a lesser sense current through the tunnel barrier layer.

6. The STO of claim 1 wherein the free ferromagnetic layer has a composition of $(Co_xFe_{100-x})_{(100-y)}M_y$, where M is an element selected from the group consisting of Al, Ge and Si and where x is between about 40 and 60 and y is between about 20 and 40.

7. The STO of claim 1 wherein the free ferromagnetic layer comprises a ferromagnetic Heusler alloy selected from the group consisting of $Co_2MnX$ (where X is selected from the group consisting of Al, Sb, Si, Sn, Ga, and Ge), NiMnSb, PtMnSb, $Co_2FeSi$, and $Co_2Fe_xCr_{(1-x)}Al$ (where x is between 0 and 1).

8. A spin-torque oscillator (STO) sensor for sensing external magnetic fields comprising:
a substrate; and
a set of layers on the substrate comprising:
a free ferromagnetic layer having an in-plane magnetization substantially free to oscillate in the presence of an external magnetic field to be sensed;
a first ferromagnetic reference layer having a fixed in-plane magnetization;
a nonmagnetic tunnel barrier layer between and in contact with the free layer and the first reference layer;
a second ferromagnetic reference layer having a fixed in-plane magnetization;
a nonmagnetic electrically conductive spacer layer between and in contact with the free layer and the second reference layer; and
three electrical terminals for connection of electrical circuitry to the sensor.

9. The sensor of claim 8 wherein a first of said three terminals is electrically coupled to the first reference layer, a second of said three terminals is electrically coupled to the second reference layer, and the third of said three terminals is electrically coupled to one of said conductive spacer layer and said free layer.

10. The sensor of claim 8 wherein the substrate is a first shield layer of magnetically permeable material and further comprising a second shield layer of magnetically permeable material, the set of layers being located between the first and second shield layers, and wherein a first of said three terminals is electrically coupled to the first shield layer, a second of said three terminals is electrically coupled to the second shield layer, and the third of said three terminals is electrically coupled to one of said conductive spacer layer and said free layer.

11. The sensor of claim 10 wherein the set of layers is a stack of layers.

12. The sensor of claim 10 wherein the second reference layer is located in substantially the same plane as the conductive spacer layer.

13. The sensor of claim 10 wherein one of said first reference layer and said second reference layer is located in substantially the same plane as the free layer.

14. The sensor of claim 8 wherein the magnetization directions of the first and second reference layers are substantially parallel to one another, and wherein the magnetization direction of the free layer, in the absence of an external magnetic field, is substantially antiparallel to the magnetization directions of the first and second reference layers.

15. A magnetic field sensing system comprising:
a spin-torque oscillator (STO) sensor for sensing external magnetic fields comprising:
a substrate; and
a set of layers on the substrate comprising:
a free ferromagnetic layer having an in-plane magnetization substantially free to oscillate in the presence of an external magnetic field to be sensed;
a first ferromagnetic reference layer having a fixed in-plane magnetization;
a nonmagnetic tunnel barrier layer between and in contact with the free layer and the first reference layer;
a second ferromagnetic reference layer having a fixed in-plane magnetization;
a nonmagnetic electrically conductive spacer layer between and in contact with the free layer and the second reference layer; and
three electrical terminals for connection of electrical circuitry to the sensor;
electrical circuitry connected to the sensor stack for supplying an excitation current through the conductive spacer layer, the excitation current having sufficient current density to cause the magnetization of the free layer to oscillate at a base frequency in the absence of an external magnetic field, and for supplying a lesser sense current through the tunnel barrier layer; and
a detector coupled to the sense current circuitry for detecting shifts in the free layer magnetization oscillation frequency from said base frequency in response to external magnetic fields.

16. A disk drive having a magnetic recording disk and a read sensor for reading recorded data from the disk comprising:
a rotatable magnetic recording disk having magnetized regions providing magnetic fields, the transitions between magnetized regions representing recorded data;
a carrier for supporting a read sensor near the disk, the carrier having a disk-facing surface;
first and second magnetically permeable shields on the carrier;
a read sensor between the first and second shields for detecting the magnetic fields from the magnetized regions on the disk, the read sensor comprising:
a free ferromagnetic layer having an in-plane magnetization oriented in a direction substantially orthogonal to the disk-facing surface of the carrier in the absence of magnetic fields from the disk and substantially free to oscillate in the presence of magnetic fields from the disk;
a first ferromagnetic reference layer not in contact with the free layer and having a fixed in-plane magnetization oriented substantially antiparallel to the magnetization of the free layer in the absence of magnetic fields from the disk;
a nonmagnetic tunnel barrier layer between and in contact with the free layer and the first reference layer;
a second ferromagnetic reference layer not in contact with the free layer and having a fixed in-plane magnetization oriented substantially parallel to the magnetization of the first reference layer;
a nonmagnetic electrically conductive spacer layer not in contact with the tunnel barrier layer and between and in contact with the free layer and the second reference layer;
means for supplying an excitation current through the conductive spacer layer, the excitation current having sufficient current density to cause the magnetization of the free layer to oscillate at a base frequency in the absence of a magnetic field from the disk;
means for supplying a DC sense current through the tunnel barrier layer with a current density less than the excitation current density; and
a detector responsive to the sense current for detecting shifts in the free layer magnetization oscillation frequency from said base frequency in response to magnetic fields from the disk.

17. The disk drive of claim 16 further comprising a first terminal connected to one of the shields, a second terminal connected to the other shield, and a third terminal connected to a layer selected from the conductive spacer layer and the free layer;
wherein the excitation current means is connected between the third terminal and one of the first and second terminals; and wherein the sense current means is connected between the third terminal and the one of the first and second terminals that is not connected to the excitation current means.

18. The disk drive of claim 16 wherein the tunnel barrier layer is in contact with one surface of the free layer and the conductive spacer layer is in contact with the opposite surface of the free layer.

19. The disk drive of claim 16 one of the first and second reference layers is recessed from the disk-facing surface of the carrier.

20. The disk drive of claim 16 wherein the second reference layer and conductive spacer layer are recessed from the disk-facing surface of the carrier.

21. The disk drive of claim 16 wherein the magnetized regions of the disk are magnetized in a direction substantially perpendicular to the disk.

* * * * *